United States Patent [19]

Scifres et al.

[11] E Patent Number: Re. 33,722

[45] Reissued Date of Patent: Oct. 22, 1991

[54] OPTICAL SYSTEM WITH BRIGHT LIGHT OUTPUT

[75] Inventors: Donald R. Scifres; D. Philip Worland, both of San Jose, Calif.

[73] Assignee: Spectra Diode Laboratories, Inc., San Jose, Calif.

[21] Appl. No.: 568,587

[22] Filed: Aug. 15, 1990

Related U.S. Patent Documents

Reissue of:

[64] Patent No.: 4,763,975
Issued: Aug. 16, 1988
Appl. No.: 43,612
Filed: Apr. 28, 1987

[51] Int. Cl.[5] ..... G02B 6/26

[52] U.S. Cl. ..... 385/33; 385/15; 385/115

[58] Field of Search ..... 350/96.15, 96.24; 372/6, 22, 27, 34

[56] References Cited

U.S. PATENT DOCUMENTS

| | | | |
|---|---|---|---|
| 3,982,201 | 9/1976 | Rosenkrantz et al. | 331/94.5 P |
| 4,358,851 | 11/1982 | Scifres et al. | 350/96.15 X |
| 4,370,021 | 1/1983 | Khoe et al. | 350/96.18 |
| 4,521,070 | 6/1985 | Sottini et al. | 350/96.15 |
| 4,553,238 | 11/1985 | Shaw et al. | 372/6 |
| 4,575,854 | 3/1986 | Martin | 372/75 |
| 4,637,685 | 1/1987 | Gordon | 350/96.20 |
| 4,653,056 | 3/1987 | Baer et al. | 372/27 |
| 4,680,767 | 7/1987 | Hakimi et al. | 372/6 |
| 4,681,396 | 7/1987 | Jones | 350/96.18 |
| 4,708,426 | 7/1987 | Khoe | 350/96.18 |

OTHER PUBLICATIONS

Chesler et al., Appl. Phys. Lett., vol. 23, No. 5, Sep. 1, 1973, pp. 235–236, "Miniature Diode-Pumped Nd:YAG Lasers".

*Primary Examiner*—Akm Ullah
*Attorney, Agent, or Firm*—Schneck & McHugh

[57] ABSTRACT

An optical system producing bright light output for optical pumping, communications, illumination and the like in which one or more fiberoptic waveguides receive light from one or more diode lasers or diode laser bars and transmit the light to an output end where it is focused or collimated into a bright light image. The input end of the fiberoptic waveguide may be squashed into an elongated cross section so as to guide light emitted from an elongated light source such as a diode laser bar. The waveguides are preferably arranged at the output end into a tightly packed bundle where a lens or other optical means focuses or collimates the light. For diode laser bars much wider than 100 microns, a plurality of waveguides may be arranged in a line to receive the light, and then stacked at the output in a less elongated configuration. In this manner, light from many diode lasers or laser bars may be coupled through the bundle into the end of solid state laser medium.

34 Claims, 3 Drawing Sheets

OPTICAL SYSTEM WITH BRIGHT LIGHT OUTPUT

Matter enclosed in heavy brackets [ ] appears in the original patent but forms no part of this reissue specification; matter printed in italics indicates the additions made by reissue.

TECHNICAL FIELD

The present invention relates to optical systems for producing a bright light output, and in particular to fiberoptic systems having a laser light source.

BACKGROUND ART

Many different methods are available for pumping solid state lasers, such as neodymium doped yttrium aluminum garnet (Nd:YAG) lasers. One common technique is to place a rod of solid state material at one focus of a tubular reflector having an elliptical cross section and a flash lamp or other bright light source at the other focus. In such an arrangement, light emitted by the flash lamp and reflector from the reflector walls will impinge on the rod. One problem with this arrangement is that the rod must have a diameter large enough to absorb a substantial portion of the pumping radiation during passage through the rod. If during this initial traverse the pumping illumination is not absorbed, it is likely to be reflected by the reflector walls back to the light source, where it will be reabsorbed, generating heat and reducing the lifetime of the source. Another problem is that much of the optical energy produced by flash lamps and other broadband light sources is wasted, because it does not match the absorption spectrum of the laser medium.

In U.S. Pat. No. 3,982,201, Rosenkrantz et al. disclose a solid state laser in which a Nd:YAG laser rod is end pumped by an array of semiconductor laser sources. The wavelength of the pump light from the diode lasers is selected for optimum absorption, while the increased optical path length of the pump light within the rod from end pumping relative to that from side pumping ensures more complete absorption. The lasers are cryogenically cooled and operate in a pulsed mode with a low duty cycle to enable heat generated by the diodes to dissipate between pulses and thereby maintain the array at a temperature which provides the desired pump wavelength.

Individual diodes and diode lasers, as well as arrays of diode lasers just described, have been directly coupled to the end of solid state rods to achieve low to medium power laser output. However, the power outputs of these solid state lasers are limited by the brightness of the pump light. In order to achieve higher power, brighter pump sources are required along with efficient means for coupling light from these sources into the solid state medium.

In U.S. Pat. No. 4,575,854, Martin discloses a Nd:YAG laser which is side pumped by a plurality of diode laser bars. Each bar contains many diode lasers which in turn circumferentially envelope a Nd:YAG rod or other suitable solid state medium. The bars are driven by a high frequency pulse which is switched so as to drive the bars in any desired combination, but not all at the same time. The laser operates in a continuous wave mode even though any given laser bar is pulsed at a very low duty factor so that the array may operate uncooled.

Diode laser bars with 30 W peak power output, a 50 Hz repeat rate and a 150 μsec pulse length have been demonstrated, and it would be desirable to use laser bars to end pump a solid state laser. However, if one were simply to butt couple a diode laser bar to the end of a solid state rod, the laser would not be efficiently pumped, because of the elongated diode laser bar geometry. Laser bars may have a lateral dimension or width of up to 1 cm, which is too great to form a small enough image to fit within the fundamental mode volume of a solid state rod. Typical rods are 3 mm in diameter and have a fundamental mode volume about 100 μm in diameter.

In U.S. Pat. No. 4,653,056, Baer et al. disclose an intra-cavity frequency-doubled Nd:YAG laser which allows efficient coupling by a high power laser diode array, despite the fact that the diode array has an output beam with too much spatial structure and limited focusability. Baer et al., achieve this result by expanding the lasing volume to match the focused image of the laser diode array. A combination of a concave output coupler mirror and a lens-shaped end at the front end of the Nd:YAG rod enables the beam size within the YAG rod to be adjusted to the appropriate volume. For efficient pumping, the pumping volume must overlap and preferably match closely the lasing volume of the rod.

It is not always possible or desirable to change the shape and size of the mode volume to match the pump light of a diode laser bar. Further, it may be desired to further increase the power by using a plurality of diode laser bars for pumping, as taught for example by Martin. Thus, ways of pumping a bright source that fits the available mode volume of a solid state laser are sought. It may also be desired to operate a plurality of diode laser bars continuously, but still provide the necessary heat dissipation.

An object of the present invention is to produce an optical system producing a bright light output.

Another object of the present invention is to produce an optical pumping system for end pumping a solid state laser.

DISCLOSURE OF THE INVENTION

The above objects have been met with optical systems in which one or more fiberoptic waveguides receive light from one or more diode lasers or diode laser bars and transmit the light to an output end where it is formed into a bright light image. The input end of a fiberoptic waveguide, which in the prior art is typically round with a diameter substantially equal to that at the output end, has in the present invention elongated core dimensions and lateral and transverse numerical apertures corresponding respectively to the typically elongated emissive area and to the lateral and transverse divergences of the light source to which it is coupled, so as to guide most of the light emitted by that source. In other words, the fiber may be squashed, flattened or otherwise elongated at the input end to match the light output by the diode laser or diode laser bar, and may be tapered to a smaller core area at the output end to match the solid state rod or slab. The optical power emitted at the output end of a fiber waveguide is greater than 50% of the total diode laser power output, and waveguide outputs as high as 88% of total laser output have been demonstrated. However, because the light emitted at the output end of an elongated fiber has a higher power density than that obtained by butt coupling a laser array to a circular core fiber of the same diameter as the laser array, the overall pumping efficiency is improved. Further, because the fiber coupled laser diode can be remotely located, thermal dissipation in the region of a solid state laser medium is not a problem.

In the case in which a plurality of diode laser or laser bar light sources are used, a plurality of fiberoptic waveguides like those just discussed are arranged at their output ends to form a bundle. Focusing optics proximate the output end may be used to image the light into a very bright spot forward of the end of the bundle, or into a collimated beam. Alternatively, butt coupling as an input to another device may be used. Each input end of a fiber waveguide is positioned proximate to one of the light sources for accepting light therefrom. In this manner, the combined optical power from many diode lasers or diode laser bars may be coupled through the fiber bundle into the end of a solid state laser medium.

In another embodiment, light from a fiber bundle is made to impinge on a partially reflecting mirror surface formed or positioned so that some of the light is reflected back into the fibers and ultimately back into the laser diodes. This serves to lock all laser diodes in-phase and creates a multiple laser coherent source. In this embodiment, single mode fibers are preferred and polarization preserving fibers could be used. Fiber ends could also be anti-reflection coated to maximize the throughput.

In a further embodiment, a laser diode bar emitting an array of light elements from an elongated emissive area is coupled into a plurality of fiberoptic waveguides. Each waveguide is positioned proximate to the diode laser bar and has a flattened input end so as to accept light elements from one segment of the array. The waveguides may then be stacked at the output end to emit a less elongated light beam made up of the individual light elements. A lens or other optical means may then couple the light into the cavity mode volume of a solid state laser medium if desired.

The present invention solves the problem of coupling elongated light sources, such as diode laser bars, into the mode volume of a solid state laser. The invention also produces a bright light source, especially where light divergence precludes lenses and where spacing and thermal dissipation problems preclude use of multiple sources. Using fiberoptic waveguides, the problem of increasing brightness is separated from usually related problems of spacing and heat dissipation. In addition to being used to optically pump solid state lasers, the optical system of the present invention, producing bright light output, may be used for surgery, scribing, welding, cutting, illuminator systems, such as beacons, communications links, rangefinders and the like.

BEST MODE FOR CARRYING OUT THE INVENTION

Figure 1:
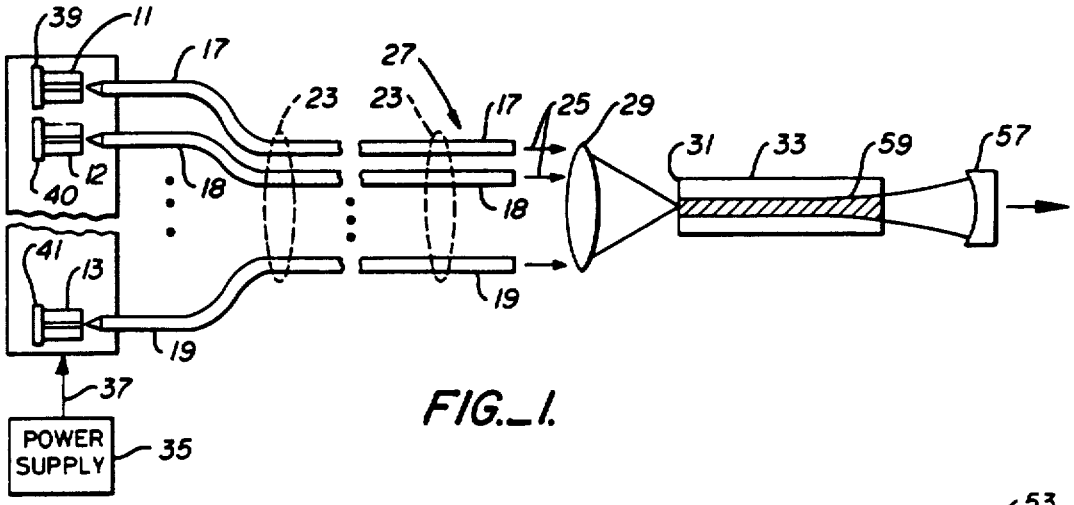
FIG. 1 is a simplified side view of an optical system of the present invention with a solid state laser.

With reference to FIG. 1, an optical system for producing a bright light output useful for pumping a solid state laser includes a plurality of semiconductor laser light sources, such as diode lasers or diode laser bars 11, 12 and 13. Typically, there are seven laser light sources, although the number may vary. Each of the laser light sources 11, 12 and 13 emits a light beam 25 which couples into one of a plurality of fiberoptic waveguides, such as waveguides 17, 18 and 19. The waveguides 17, 18 and 19 are arranged to form a bundle 23, and emit the light 25 guided by waveguides 17, 18 and 19 from light sources 11, 12 and 13 and emitted at an output end 27 of the waveguide bundle 23. Optics, such as the lens of lens system 29 in FIG. 1, may be disposed in front of output end 27 to focus the light 25 into a bright light image which may, for example, couple into the end 31 of a solid state laser medium 33. Alternatively, the fiber bundle may be butt coupled to the rod. Note that the solid state laser rod may act as a light guide via total internal reflection in order to confine the diverging pump light rays, thereby allowing for more efficient light absorption.

Each light source 11, 12 and 13 is typically a high power semiconductor diode laser bar, such as any of the (GaAl)As phased array lasers or broad area lasers known in the art. Alternatively, semiconductor diodes and individual diode lasers may be used. Lasers and laser arrays composed of light emitting semiconductor materials other than (GaAl)As, such as InGaAsP, may also be used. Typically, each light source emits with a continuous wave optical power output of at least 200 mW, and preferably at least 500 mW. Semiconductor laser arrays with facet windows fabricated by silicon impurity induced disordering have been demonstrated with continuous power outputs of up to 3 Watts before exhibiting catastrophic facet damage. One such laser is disclosed in an article by R. L. Thornton, et al. in Applied Physics Letters, vol. 49, no. 23, Dec. 8, 1986, pp. 1572-1574. In short pulse operation, i.e. shorter than 1 μs pulse lengths, the catastrophic power limit increases inversely as the square root of the pulse length. Lasers with 100 nsec pulses and 10 kHz repeat rate can be used in the present invention to produce an optical system with 20 W peak power output from the fiber bundle 23.

The lasers can be modulated up to gigahertz rates by simply varying the drive current so that the system can be used as part of a communication link.

A power supply 35, in electrical communication with laser light sources 11, 12 and 13, as indicated by arrow 37, supplies electrical power to drive the light sources. Typically, the light source operate at about 25% electrical to optical overall efficiency. Efficiencies of up to 50% have been achieved. Accordingly, each laser light source producing 500 mW continuous optical power output draws about 1 A current and 2 V. Thus, power supply 35 may be a lightweight portable battery unit delivering at least 14 W. The light sources 11, 12 and 13 may be connected in any of various series-parallel combinations depending on the most convenient power supply. The remaining electrical power drawn by the light source results in heat which is removed by heat sinks 39, 40 and 41. Temperature control may be required in some optical pumping applications to ensure that the wavelength of the laser output coincides with the absorption band of lasing material 33. The system typically operates at the ambient temperature, i.e. about 15° C. to 25° C.

Figure 2:
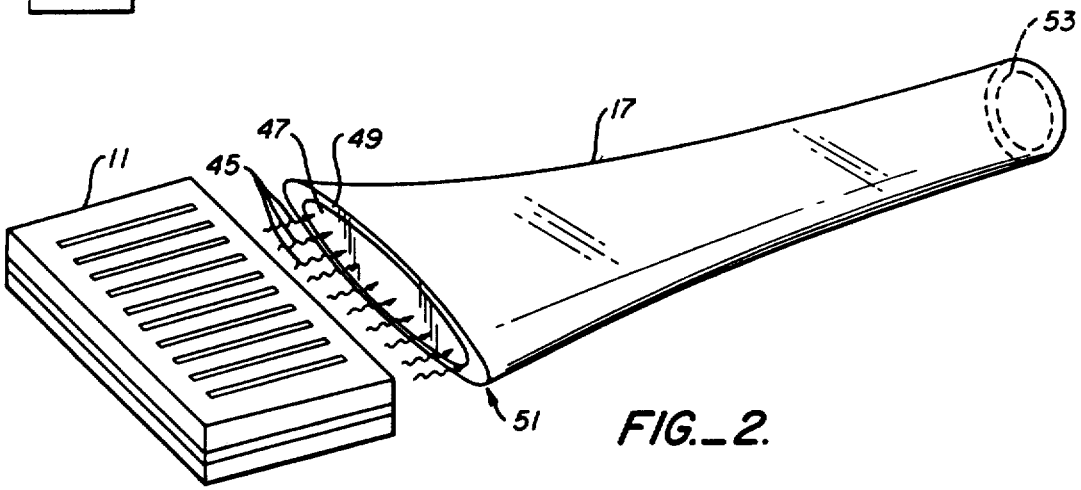
FIG. 2 is a perspective view of a laser light source and the input end of a fiberoptic waveguide in the optical system of FIG. 1.

With reference to FIG. 2, each laser light source 11 has an elongated emissive area. For example, the preferred diode laser bar 11, seen in FIG. 2 typically has a substantially rectangular emissive area with a lateral dimension or width of about 100 μm and a transverse dimension or height of about 1 μm. The far field profile of the emitted light 45 from such a laser is characterized by lateral and transverse divergences, typically about 7° and 30° respectively.

In order to efficiently couple light 45 from laser bar 11 into a fiberoptic waveguide 17, the waveguide is squashed at one end into an elongated shape. Waveguide 17 comprises a transparent core 47 characterized by a first index of refraction, and a cladding 49 surrounding core 47 and characterized by a second lower index of refraction. The cladding 49 is preferably thin, i.e. about 2 μm thick. The numerical aperture (N.A.) of a fiberoptic waveguide, i.e. the sine of the half-angle within which the fiber can accept or radiate light guided by the fiber, is a function of the indices of refraction of core 47 and cladding 49 and other factors, and is indicative of the ability of the fiber or waveguide to couple light from laser light sources 11, 12 and 13. Typically waveguide 17 is an 0.3 N.A. waveguide with a 50 μm core diameter circular cross section, which is then elongated at an input end 51 to an elliptical cross section with 120 μm by 20 μm core dimensions. Transition from circular to elliptical cross section is about 0.5 cm but the fiber could be several meters in length. Squashing the fiber waveguide causes the core material to emerge slightly from the cladding in the form of a semiellipsoidal lens. This lens may be retained to further improve coupling into the fiberoptic waveguide 17 or the waveguide end 51 may be mechanically polished flat for butt coupling to laser bar 11. Fiberoptic waveguides with rectangular cross sections may also be used.

The fiberoptic waveguide 17 is shown in FIG. 2 to be spaced proximate to laser bar 11. Typically, however, waveguide 17 abuts laser bar 11 with the major elliptical axis of the waveguide core aligned with the lateral direction of laser bar 11. The waveguide 17 efficiently couples light from laser bar 11 because the elongated core dimensions correspond closely to the dimensions of the laser bar's emissive area. Further, the input numerical apertures measured in both the lateral and transverse directions are altered by the flattening process from the intrinsic numerical aperture of the circular core fiberoptic waveguide from which waveguide 17 is formed. Typically, waveguide 17 has a lateral numerical aperture of about 0.125, corresponding to acceptance of light with up to 14° lateral divergence. Waveguide 17 also has a transverse numerical aperture of about 0.75, corresponding to acceptance of light with up to 97° transverse divergence. These acceptance angles are at least twice the lateral and transverse divergences of the laser bar 11, sufficient to couple most of the light emitted by laser bar 11. Typically, the coupling efficiency is at least 50% and typically about 75%. Coupling efficiencies as high as 88% have been achieved.

Figure 3:
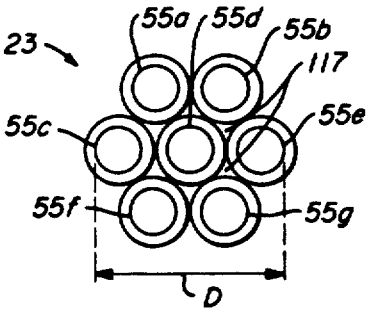
FIG. 3 is a front end view of a fiberoptic bundle of the optical system of FIG. 1.

With reference to FIG. 3, the plurality of fiberoptic waveguides 17, 18 and 19 in FIG. 1, are arranged into a bundle 23 of waveguides, here indicated by the reference numerals 55a through 55g. Typically, the waveguides 55a–55h are arranged in a hexagonal close packed array for maximum brightness. Seven waveguides, having core diameters of about 50 μm and cladding thicknesses of about 2 μm, produce a bright light source with an effective diameter D of about 170 μm. For lasers with 500 mW continuous output, and a 75% coupling efficiency, the bundle 23 produces a continuous bright output of approximately 2.5 watts. Higher power outputs up to about 7.5 watts continuous wave can be achieved if the individual lasers operate up to their catastrophic limits, or sequentially in a pulsed mode.

Figure 4:
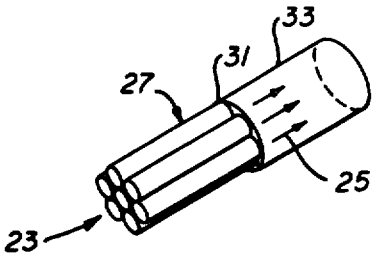
FIG. 4 is a side plan view of the fiberoptic bundle in FIG. 3 butt coupled to an end of a solid state laser medium.

With reference to FIG. 4, an output end 27 of a bundle 23 of fiberoptic waveguides is butt coupled to an end 31 of a solid state active lasing medium 33. The medium 33 may be in the form of a cylindrical rod, as shown, or a rectangular slab or other convenient shape. The medium 33 may be any solid material which has been developed for lasers, including neodymium doped yttrium aluminum garnet (Nd:YAG), Nd:glass, Nd:YLF, Nd:YALO, Er:YAG, ruby, and alexandrite, provided the output wavelength of the fiberoptic bundle 23 matches an absorption band of the medium 33. For example, for Nd:YAG pumping, the light 25 output by laser light sources 11, 12 and 13 and transmitted by fiberoptic bundle 23 has a wavelength of about 0.8 μm. End 31 of medium 33 typically has a coating which is highly reflective at the lasing wavelength, 1.06 μm for Nd:YAG lasers, and which is antireflective and highly transmissive to light 25 at the pumping wavelength, 0.8 μm for Nd:YAG lasers. Butt coupling, as seen in FIG. 4, is adequate for multimode laser operation, but may waste considerable optical energy for single transverse mode laser operation.

Referring again to FIG. 1, in order to efficiently pump medium 33 for single transverse mode operation, it is preferable that the pump light 25 emitted from bundle 23 be focused to a spot size which substantially matches the mode volume of the desired lasing mode. This mode volume is determined from the resonant optical cavity of the solid state laser defined between end 31 and laser output mirror 57. The mode volume 59 in active medium 33 is a function of the curvatures of end 31 and mirror 57 and the distance between them. Typically, for a 3 mm diameter rod, the lowest order mode volume has a diameter of about 100 μm. A lens 29 or multiple lens system may be used to focus the light from bundle 23. Typically, lens 25 has a focal length of about 6 cm.

Applications other than optically pumping a solid state laser, such as communications, illumination, beacons and the like, require a collimated beam output from bundle 23. To produce a beam divergence comparable to a 1 to 10 mW helium-neon laser, i.e. a 1 mrad divergence, a 17 cm focal length lens 29 is required. Lens 29 should have a diameter of about 10 cm for a bundle of 0.3 N.A. fiberoptic waveguides. Such a system produces an optical power density of about 0.35 $\mu W/cm^2$ at a distance of 30 km, which is easily detectable by conventional silicon photodetectors.

Figure 5:
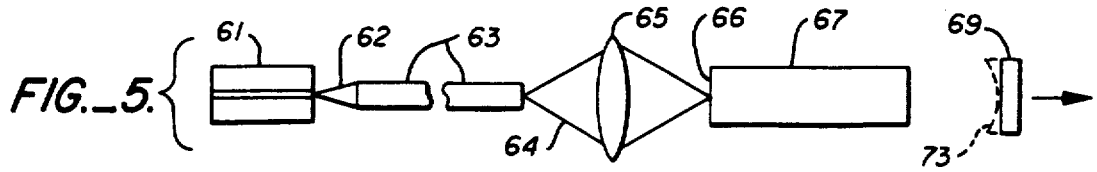
FIG. 5 is a side plan view of a second optical system and solid state laser embodiment of the present invention.
Figure 6:
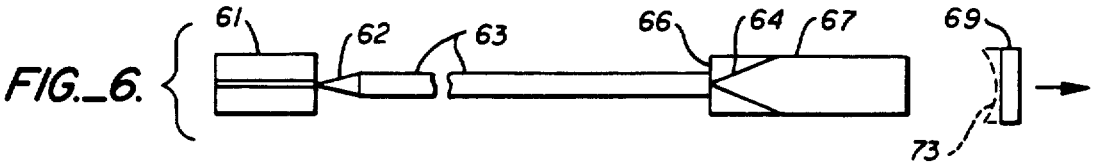
FIG. 6 is a side plan view of a third optical system and solid state laser embodiment of the present invention.
Figure 7:
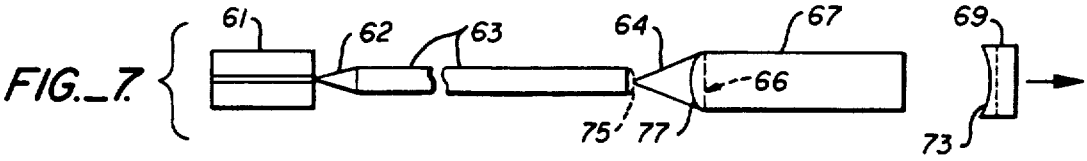
FIG. 7 is a side plan view of a fourth optical system and solid state laser embodiment of the present invention.

With reference to FIGS. 5–7, an optical pumping system for pumping a solid state laser includes a semiconductor diode laser bar 61, broad area laser or other elongated light source. Laser bar 61 emits a light beam 62 which is coupled into a fiber optic waveguide 62. The input end of waveguide 63 is elongated, as in FIG. 2, so as to have core dimensions and lateral and transverse numerical apertures which correspond respectively to the emission area and lateral and transverse divergences of laser bar 61. Thus, waveguide 63 butt coupled or otherwise positioned proximate to laser bar 61 guides most of the light 62 emitted by laser bar 61. Various optical means are shown for coupling light 64 emitted from the output end of waveguide 63 into an end 66 of solid state laser material 67. In FIG. 5, a focusing lens 65 couples light 64 into medium 67. In FIG. 6, waveguide 63 is butt coupled to the end 66 of medium 67. In FIG. 7, one or both of end 75 of waveguide 63 or surface 77 of end 66 is curved, thereby effectively focusing light 64 into medium 67. These optical means cooperate with the output end of waveguide 63 to match the light 64 to a desired mode of the resonant optical cavity of the laser. Solid state medium 67 may be in the form of a cylindrical rod, rectangular slab or other convenient shape. Reflective output mirror 69 may have a concave surface 73 or be planar. Medium 67 is typically provided with a coating on end 66 which is highly reflective at the lasing wavelength and antireflective at the pump wavelength. With any of these embodiments, the light from the elongated emissive area of a diode laser bar is efficiently coupled into the mode volume of a solid state laser.

Figure 8:
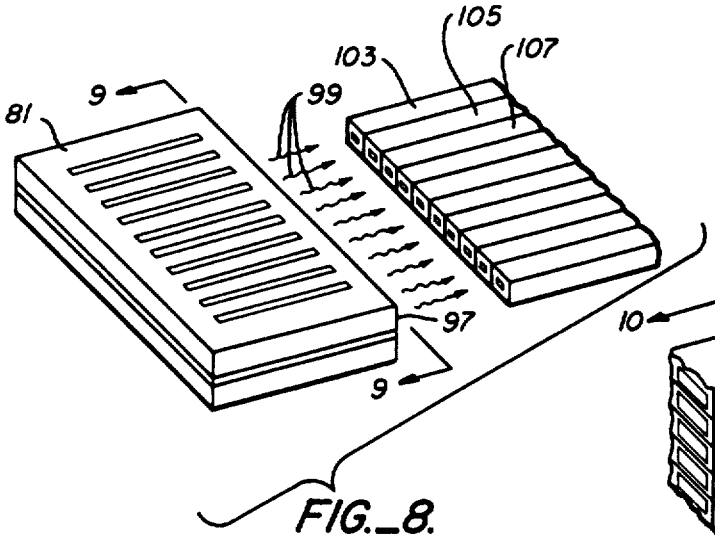
FIG. 8 is a perspective view of a diode laser bar and a plurality of fiberoptic waveguides for another optical system of the present invention.

With reference to FIG. 8, a semiconductor diode laser bar 81 may have a width greater than 100 $\mu$m up to 1 centimeter or more. The laser bar 81 may thus emit a plurality of light elements ranging from a few to several thousand or more. To date, 100 $\mu$m core diameter fibers have been squashed to 460 $\mu$m by 18 $\mu$m cross sections with a coupling efficiency greater than 50 percent. It may be somewhat difficult to squash a single fiber to dimensions of 1 cm width.

Figure 9:
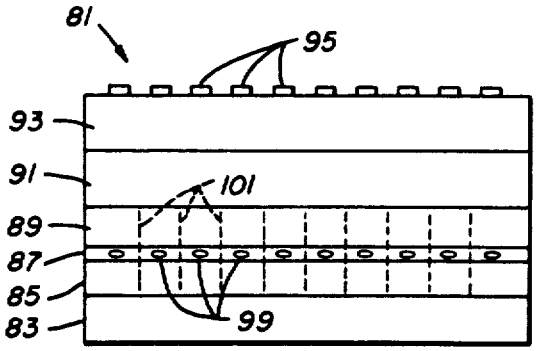
FIG. 9 is an end view of the diode laser bar of FIG. 8 taken along the line 9—9.

In FIG. 9, laser bar 81 comprises a plurality of contiguous semiconductor layers 83, 85, 87, 89, 91 and 93, of which at least one layer 87 forms an active region for lightwave generation and propagation under lasing conditions. Laser bar 81 may be constructed in any of the known ways for producing a laser bar 81, preferably with stable phase locked output. For example, laser bar 81 may have a plurality of conductive contact stripes 95 for introducing lateral gain guiding. Laser arrays with real refractive index guiding may also be used. Active region 91 together with cladding layers 85 and 89 form an emissive area at reflective facet 97, emitting light elements 99, seen in both FIG. 8 and FIG. 9.

For the purpose of coupling this emissive area to fiberoptic waveguides, the emissive area formed by layers 85, 87 and 89 is divided into a plurality of segments demarcated by dashed lines 101. The divisions may be made anywhere in the emissive area, provided that each segment emits at least one light element 99 in the array of light elements, and provided that the width of each segment does not exceed 200 $\mu$m at most and preferably does not exceed 150 $\mu$m. In FIG. 8, a plurality of fiberoptic waveguides 103, 105, 107, etc. are disposed in front of the emissive area of laser bar 81 for accepting and guiding light elements 99 from the laser segments. Preferably, the core of each waveguide 103, 105, 107, etc. has a rectangular cross section, although elliptical and circular cross-section waveguides may also be used. The input end of each waveguide has squashed or elongated core dimensions corresponding to the dimensions of the laser segment proximate thereto, and should also have lateral and transverse numerical apertures corresponding to respective lateral and transverse divergences characteristic of the lasing elements 99.

Figure 11:
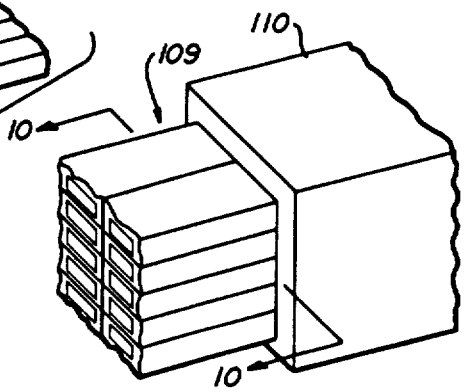
FIG. 11 is a perspective view of the output end of FIG. 10 coupling to a solid state laser slab.
Figure 10:
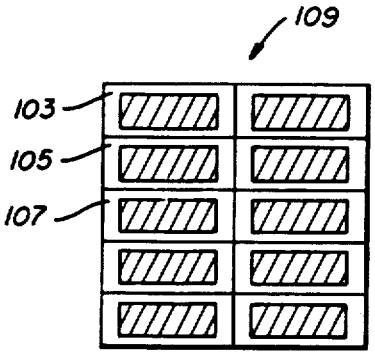
FIG. 10 is an end view of the stacked output end of the fiberoptic waveguides of FIG. 8.

Referring to FIGS. 10 and 11, the fiberoptic waveguides 103, 105, 107, etc. are stacked or otherwise arranged at an output end 109 to form a bundle with less elongated dimensions than the laser bar's emissive area. This bundle may be coupled to an end of a solid state laser medium 110, here shown as a rectangular slab. For example, if laser bar 81 has an emission area 1 mm wide and 10 $\mu$m high emitting 100 light elements, the emissive area may be divided into 10 laser segments each 100 m wide and each containing 10 light elements. Each fiberoptic waveguide 103, 105, 107, etc. may then be elongated at the input end to 100 $\mu$m wide by 20 $\mu$m high with core dimensions of about 96 $\mu$m wide and 16 $\mu$m high. When stacked or arranged into a bundle at the output end as shown in FIG. 10, the bundle measures 100 $\mu$m wide by 200 $\mu$m high. The elongation of the light emitted by laser bar 81 has thus been reduced in this example from a width to height ratio of 100 to 1 to a ratio of 2 to 1. Other dimensions and other stacking configurations may be used to produce a less elongated light output for optical pumping or other application.

Figure 12:
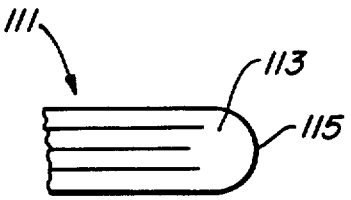
FIGS. 12-16 are side perspective views of embodiments of the output end of a fiberoptic waveguide bundle in accord with the present invention.
Figure 13:
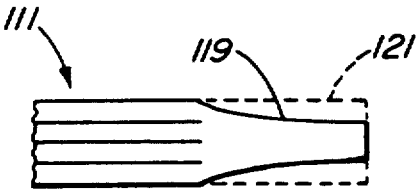
Figure 14:
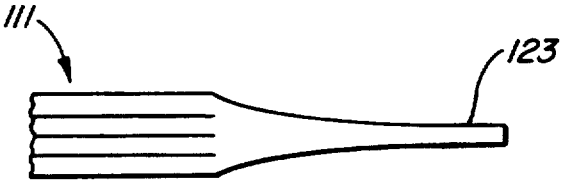

In FIGS. 12–16, various ways of forming the output end of a fiber bundle 111 are seen. In FIG. 12, the end of bundle 111 is fused so as to form a bead 113 of molten core material. When the bead 113 cools and hardens, all of the fiber waveguides of bundle 111 are fused together. Further, the surface 115 of bead 113 is curved to as to function as a convergence lens to light output from the waveguide bundle. In FIG. 13, a greater length of bundle 111 is heated, preferably to the melting point of the fibers. As a result, the fibers are not only fused together, but also air gaps, such as gaps 117 in FIG. 4, between the fibers are removed and a homogeneous rod 119 is formed on the end of bundle 111. Rod 119 functions as a mixing rod to blend the light coming from the individual fiber waveguides of bundle 111 and thereby produce a more spatially uniform light output. Further, because the air gaps have been removed in forming rod 119, the rod 119 has a reduced diameter and greater optical power density than bundles within this rod. The original diameter of bundle 111 is indicated by dashed lines 121 representing the original fiber waveguides from which rod 119 was formed. In FIG. 14, the fiber bundle 111 is formed processed by a combination of heating and pulling. A tapered output rod 123 results. Tapered rod 123 is characterized by a diameter which is typically reduced by about one-half compared to mixing rod 119 in FIG. 13. This produces a greater optical power density but also with greater light divergence.

For example, a 200 μm diameter bundle of 0.3 NA fibers, when terminated in a rod 123 tapered to 100 μm diameter emits light with a 0.6 NA.

Figure 15:
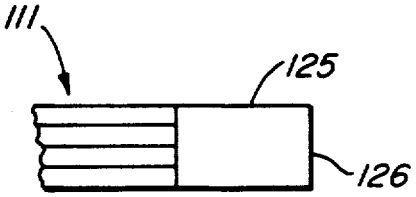
Figure 16:
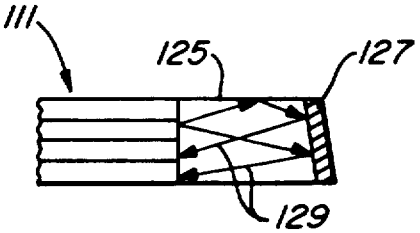

In FIGS. 15 and 16, the output end of fiber bundle 111 is not melted, but instead butted against a glass mixing rod 125. In FIG. 15, rod 125 performs the same function as melted rod 119 in FIG. 13, namely blending the light from the fiber waveguides of the bundle to produce a uniform light output. If desired, an antireflection coating may be applied to the end 126 of rod 125. In FIG. 16, a partial reflector 127 is added to the end of rod 125. Portions of the light rays 129 diverging from fiber waveguides in bundle 111 is reflected by mirror 127 back into the bundle 111. This light is then coupled back into laser light sources on the input ends of the fiber waveguides. Since the light diverges and is mixed in rod 125, a portion of the light originating from one laser ends up being coupled back into another laser, and the lasers can become phase locked. Thus, the embodiment in FIG. 16 produces coherent emission from all the lasers in the bundle. Preferably, the fiberoptic waveguides are polarization preserving single mode fibers. A reflectivity of at least 5% for mirror 127 is sufficient to produce coherent light output.

The present invention produces a bright light output derivative from a plurality of light sources of an extremely elongated light source suitable for optical pumping a solid state laser. The invention is also applicable as a communications link for ground-to-ground, ground-to-air, ground-to-space, ship-to-shore communications, as a designator, range finder, illuminator, beacon, welding, cutting, scribing, or any other application requiring a bright collimated light source.

We claim:

1. An optical system for producing a bright light output comprising, a plurality of light sources, each of said light sources emitting light from a given emissive area with given lateral and transverse divergences, a plurality of fiberoptic waveguides, each of said waveguides having an oblong input end and an output end, each oblong input end positioned relative to one of said light sources for accepting light therefrom, each oblong input end having core dimensions and lateral and transverse numerical apertures corresponding respectively to said emissive area and said lateral and transverse divergences of said one of said light sources so as to guide most of said light emitted by said light source, said fiberoptic waveguides being arranged at said output ends to form a bundle.

2. The system of claim 1 wherein each of said light sources is a diode laser.

3. The system of claim 1 wherein each of said light sources is a laser diode bar, each input end of said waveguides having an oblong core with a width at least as great as that of said laser diode bar.

4. The system of claim 1 wherein each light source is a pulsed laser.

5. The system of claim 4 wherein said light sources are operated serially such that the total light intensity from all of said light sources is substantially constant in time.

6. The system of claim 1 wherein each light source is a continuous wave laser.

7. The optical system of claim 1 further comprising optical means in proximity to each output end of said bundle of waveguides for focusing said light into a bright light image.

8. The system of claim 7 wherein said optical means couples said light into an end of a solid state active medium in a resonant optical cavity.

9. The system of claim 8 wherein said optical means is a focusing lens between the output ends of said bundle of waveguides and an end of said medium, the lens matching said light to a desired mode of said resonant optical cavity.

10. The system of claim 8 wherein said optical means is butt coupling said bundle to an end of said medium.

11. The system of claim 1 wherein said waveguides are arranged in a substantially circular cylindrical bundle of hexagonal-close-packed waveguides.

12. The system of claim 1 wherein said input end of said waveguide has a curved lens surface.

13. The system of claim 1 wherein the output ends of said waveguides terminate in a bead with a curved lens surface.

14. The system of claim 1 wherein the output end of said bundle is fused to form a homogeneous mixing rod.

15. The system of claim 1 wherein the output end of said bundle is tapered to a smaller diameter than the bundle diameter.

16. The system of claim 1 wherein a homogeneous mixing rod is butted to the output end of said bundle of waveguides.

17. The system of claim 16 wherein a partially reflecting mirror is disposed on an end of the mixing rod.

18. An optical system comprising, a laser diode bar emitting a plurality of light elements from an oblong emissive area having a width and a height, the light elements radiating with characteristic lateral and transverse divergences, the emissive area being divided into a plurality of segments, each segment having at least one light element, a plurality of fiberoptic waveguides, each of said waveguides having an oblong input end and an output end, the oblong input end of each waveguide being positioned relative to said laser diode bar for guiding light elements from one of said segments, the elongated input end of each waveguide having core dimensions and lateral and transverse numerical apertures corresponding respectively to a segment and said characteristic lateral and transverse divergences so as to guide most of said light emitted from said segment, said waveguides being arranged at said output end to form a bundle.

19. The optical system of claim 18 further comprising, optical means in proximity to said output ends of said bundle of waveguides for coupling said light elements into an end of a solid state active medium in a resonant optical cavity.

20. The system of claim 19 wherein said optical means is a focusing lens between said output ends and said medium.

21. The system of claim 19 wherein said bundle is butt coupled to an end of said medium.

22. An optical system for producing a bright light output comprising, a plurality of light sources, each of said light sources emitting light from a given emissive area with given lateral and transverse divergences, a plurality of fiberoptic waveguides, each of said waveguides having an oblong input end and an output end, each oblong input end positioned relative to one of said light sources for accepting light therefrom, each oblong input end having core dimensions and lateral and transverse numerical apertures corresponding respectively to said emissive area and said lateral and transverse divergences of said one of said light sources so as to guide most of said light emitted by said light source, said fiberoptic waveguides being arranged at said output ends to form a bundle, and optical means in proximity to each output end of partially reflecting a portion of said light emerging from said waveguides back into said waveguides thereby coupling said portion of said light into said light sources to induce coherent emission of said light sources.

23. The optical system of claim 22 wherein said waveguides are single mode waveguides.

*24. The system of claim 1 wherein said oblong input end of each of said fiberoptic waveguides is rectangular.*

*25. The system of claim 18 wherein said oblong input end of each of said fiberoptic waveguides is rectangular.*

*26. The system of claim 22 wherein said oblong input end of each of said fiberoptic waveguides is rectangular.*

*27. An optical system for producing a bright light output comprising:* a plurality of light sources, each of said light sources emitting light from a given emissive area with given lateral and transverse divergences, a plurality of fiberoptic waveguides, each of said waveguides having an oblong input end and an output end, each oblong input end positioned relative to one of said light sources for accepting light therefrom, each oblong input end having core dimensions corresponding to said emissive area and a numerical aperture capable of guiding most of said light emitted by said light source, said fiberoptic waveguides being arranged at said output ends to form a bundle.

*28. The system of claim 27 wherein said oblong input end of each of said fiberoptic waveguides is rectangular.*

*29. The system of claim 27 wherein said numerical aperture of each input end corresponds to the larger of said lateral and transverse divergences of said one of said light sources.*

*30. An optical system comprising:*

*a laser diode emitting a plurality of light elements from an oblong emissive area having a width and a height, the light elements radiating wih characteristic lateral and transverse divergences, the emissive area being divided into a plurality of segments, each segment having at least one light element,*

*a plurality of fiberoptic waveguides, each of said waveguides having an oblong input end and an output end, the oblong input end of each waveguide being positioned relative to said laser diode bar for accepting light elements from one of said segments, the oblong input end of each waveguide having core dimensions corresponding to a segment and a numerical aperture capable of guiding most of said light emitted from said segment, said waveguides being arranged at said output ends to form a bundle.*

*31. The system of claim 30 wherein said oblong input end of each fiberoptic waveguide is rectangular.*

*32. The system of claim 30 wherein said numerical aperture of each waveguide corresponds to the larger of said lateral and transverse divergences of said light elements.*

*33. The system of claim 30 wherein said bundle has width and height dimensions such that the ratio of width to height of said bundle is less than the ratio of width to height of said emissive area of said laser diode bar.*

*34. The system of claim 30 further comprising optical means in proximity to said output ends of said bundle of waveguides for coupling said light elements into a solid state laser medium.*

* * * * *